(12) United States Patent
Nellissen

(10) Patent No.: US 6,657,208 B2
(45) Date of Patent: Dec. 2, 2003

(54) METHOD OF FORMING OPTICAL IMAGES, MASK FOR USE IN THIS METHOD, METHOD OF MANUFACTURING A DEVICE USING THIS METHOD, AND APPARATUS FOR CARRYING OUT THIS METHOD

(75) Inventor: Antonius Johannes Maria Nellissen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 343 days.

(21) Appl. No.: 09/886,203

(22) Filed: Jun. 21, 2001

(65) Prior Publication Data

US 2002/0030800 A1 Mar. 14, 2002

(30) Foreign Application Priority Data

Jun. 22, 2000 (EP) .............................. 00202169

(51) Int. Cl.[7] .............................. H01J 37/30; G21K 5/00
(52) U.S. Cl. ...................... 250/492.2; 378/35
(58) Field of Search .................... 250/492.2, 492.1; 378/35

(56) References Cited

U.S. PATENT DOCUMENTS

| | | | | |
|---|---|---|---|---|
| 4,895,790 A | * | 1/1990 | Swanson et al. | 216/47 |
| 5,229,255 A | * | 7/1993 | White | 430/22 |
| 5,464,712 A | * | 11/1995 | Han | 430/322 |
| 5,612,986 A | | 3/1997 | Howells et al. | 378/34 |
| 5,840,448 A | * | 11/1998 | Borodovsky et al. | 430/5 |
| RE36,352 E | * | 10/1999 | Swanson et al. | 359/565 |
| 6,096,457 A | * | 8/2000 | Pierrat | 430/5 |
| 6,255,024 B1 | * | 7/2001 | Pierrat | 250/492.2 |

OTHER PUBLICATIONS

"X–Ray Holography for VLSI Using Synthetic Bilevel Holograms", by R.E Burge et al., SPIE vol. 3183, 1997, pp. 2–13.

* cited by examiner

Primary Examiner—Bruce Anderson
(74) Attorney, Agent, or Firm—Aaron Waxler

(57) ABSTRACT

The resolution achieved with a proximity printing method and apparatus can be increased considerably by using, instead of a photo mask, a diffraction mask (30) wherein the image information is encoded in a two-dimensional array (32) of image cells (37) having dimensions which are smaller than the minimum feature size to be printed, each image cell having one out of at least two amplitude levels and one out of at least three phase levels. The mask may be a multiple focus mask which has multiple focal planes within one image field.

17 Claims, 8 Drawing Sheets

METHOD OF FORMING OPTICAL IMAGES, MASK FOR USE IN THIS METHOD, METHOD OF MANUFACTURING A DEVICE USING THIS METHOD, AND APPARATUS FOR CARRYING OUT THIS METHOD

The invention relates to a method of forming a desired optical image having a given minimum feature size on a selected surface of material sensitive to optical radiation, the method comprising the steps of:

providing a source of optical radiation having at least one predetermined wavelength $\lambda$;

providing a layer of material, sensitive to optical radiation having the wavelength $\lambda$, with a selected surface to receive an optical image thereon;

positioning a mask, comprising image information and being at least partly transparent to the source radiation, between the radiation source and the layer of sensitive material, so that source radiation is transmitted through the mask towards the sensitive layer, and illuminating the selected surface with source radiation received by transmission through the mask to produce the desired optical image.

The invention also relates to a mask for use with this method, a method of manufacturing a device using this method and an apparatus for carrying out this method.

This method and apparatus, referred to as proximity printing method and apparatus, are used, inter alia, in the manufacture of liquid crystalline display (LCD) panels, customer ICs (integrated circuits) and PCBs (printed circuit board). Proximity printing is a fast and cheap method of forming an image, comprising features corresponding to the device features to be configured in a layer of a substrate, in a radiation-sensitive layer on the substrate. Use is made of a large photo mask that is arranged at a short distance, called the proximity gap, from the substrate and the substrate is illuminated via the photo mask by, for example, ultraviolet (UV) radiation. An important advantage of the method is the large image field, so that large device patterns can be imaged in one image step. The pattern of a conventional photo mask for proximity printing is a true, one-to-one copy, of the image required on the substrate, i.e. each picture element (pixel) of this image is identical to the corresponding pixel in the mask pattern.

Proximity printing has a limited resolution, i.e. the ability to reproduce the points, lines etc., in general the features, in the mask pattern as separate entities in the sensitive layer on the substrate. This is due to the diffractive effects which occur when the dimensions of the features decrease with respect to the wavelength of the radiation used for imaging. For example, for a proximity gap of 100 $\mu$m, the resolution is 10 $\mu$m, which means that pattern features at a mutual distance of 10 $\mu$m can be imaged as separate elements. To increase the resolution in optical lithography, real projection apparatus, i.e. apparatus having a real projection system like a lens projection system or a mirror projection system, are used. Examples of such apparatus are wafer steppers or wafer step-and scanners. In a wafer stepper, a mask pattern, for example an IC pattern is imaged in one step by a projection lens system on a first IC area of the substrate. Then the mask and substrate are moved relative to each other until a second IC area is positioned below the projection lens. The mask pattern is then imaged on the second IC area. These steps are repeated until all IC areas of the substrate are provided with an image of the mask pattern. This is a time consuming process, due to the sub-steps of moving, aligning and illumination. In a step-and-scanner, only a small portion of the mask pattern is illuminated and, during illumination, the mask and the substrate are synchronously moved with respect to the illumination beam until the whole mask pattern has been illuminated and a complete image of this pattern has been formed on an IC area of the substrate. Then the mask and substrate are moved relative to each other until the next IC area is positioned under the projection lens and the mask pattern is scan-illuminated, so that a complete image of the mask pattern is formed on the next IC area. These steps are repeated until all IC areas of the substrate are provided with a complete image of the mask pattern. The step-and-scanning process is even more time consuming than the stepping process.

If a 1:1 stepper, i.e. a stepper with a magnification of one, is used to print an LCD pattern, a resolution of 3 $\mu$m can be obtained, however at the expense of much time for imaging. Moreover, as the image field is divided into sub-fields, stitching problems may occur, which means that neighbouring sub-fields do not fit exactly together.

It is an object of the present invention to provide a proximity printing method and a mask for use therewith which allow increase of the resolution of the order of that obtainable with an optical lithographic projection apparatus for the same purpose, and, moreover, opens the way to new possibilities which cannot be realized by either conventional proximity printing methods or steppers or step-and-scanners. The method is characterized in that use is made of a mask in the form of a diffractive element wherein the image information is encoded in a two-dimensional array of image cells having dimensions which are smaller than the minimum feature size, each image cell having one out of at least two specific transmission levels and one out of at least three phase levels.

The amplitude level and the phase level of an image cell are measures of the degree to which the amplitude and the phase, respectively, of a beam portion incident on this image element are changed by the image cell.

The method of the invention makes effective use of the diffraction effect, which is the resolution limiting factor in the conventional method. The mask pattern is no longer identical to the required image on a pixel by pixel basis, but is encoded in small image cells. Such an image cell is not identical to a given pixel in the required image, but changes, in co-operation with a number of neighbouring image cells, both the amplitude and phase of the portion of the illumination beam passing through the area of these image cells, such that a portion of the required image is formed in the sensitive layer on the substrate. The method uses two independent coding parameters: the amplitude and the phase of an image cell, which enlarges the mask design possibilities. Each of these parameters has one out of a number of discrete values, or levels. The number of amplitude levels is two or more and the number of phase levels is three or more. The mask design is the result of a computing technique similar to the technique of computer generated holograms. The resulting amplitude level for each image element may be implemented in the mask by a coat layer, having a specific transmission, on the image information carrying surface of the transparent mask substrate and the phase level by adapting the thickness of this substrate.

It is noted that the article: "X-ray holography for VLSI using synthetic bilevel holograms" in SPIE, Vol. 3183, 1997, pages 2–13 describes a specific X-ray proximity printing method which uses synchroton radiation of very short wavelength, of the order of 1 nm, synchrotron radiation for the manufacture of VLSI electronic circuits having smallest feature sizes of the order of 100 nm. To increase the gap width from the unpractical value of 4 µm to the more practical value of 10 µm or larger, the conventional X-ray mask, having a pattern configuration identical to the configuration of the image to be formed, is replaced by a so-called bilevel computed hologram. The known method differs from that of the present invention not only in that the ratios of the smallest feature size and the wavelength used and the gap width, respectively are totally different, but also in that the mask elements are several hundred X-ray wavelengths thick, so that waveguide effects play a role. Moreover, the hologram used in the X-ray method has only two phase levels, which introduce a phase shift of zero and π radians, respectively.

Also U.S. Pat. No. 5,612,986 describes a method for imaging an IC mask pattern on a substrate via a mask and by means of X-ray radiation. The conventional X-ray mask has been replaced by a diffraction element having several amplitude steps and several phase steps. However, the amplitude steps are the result of the different thicknesses of the mask substrate needed for the phase steps and the different amplitude attenuation introduced thereby. The phase level and amplitude level of an image cell cannot be chosen independently of each other.

The method of the invention is preferably characterized in that the illumination step comprises illuminating the mask with a beam having an aperture angle of the order of a few degrees.

The aperture angle of the illumination beam is understood to be the angle between the outermost rays of this beam, which is not fully collimated and thus has a collimation angle, which is half of the aperture angle. The collimation angle may be, for example, 1 or 1.5 degree and the aperture angle thus, for example, 2 or 3 degrees for gap width smaller than 100 µm. For larger gap widths the aperture angle may be smaller than one degree. The use of an illumination beam with such a small aperture angle improves the method, because the risk of a speckle pattern occurring in the printed image is reduced thereby.

The method of the invention may be further characterized in that use is made of a radiation source which emits radiation of at least two discrete wavelengths.

In a conventional proximity printing apparatus a mercury arc discharge lamp is generally used as the radiation source. This lamp emits radiation of different wavelengths, also called different (spectral) lines. Usually, radiation of one of the wavelengths is selected to illuminate the mask and radiation of the other wavelengths is prevented from reaching the mask. The method of the present invention allows simultaneous use of radiation of different wavelengths by adapting the design of the mask to the different wavelengths. Thus, more efficient use can be made of the available radiation.

Preferably the method of the present invention is characterized in that use is made of a mask which comprises areas which differ from each other in that their image information is encoded such that upon illumination of these areas and their surrounding areas with one illumination beam, the sub-images of these areas are formed in planes different from the planes wherein the sub-images of the surrounding area are formed.

This method allows simultaneous printing of different portions of the mask pattern in different image planes, thus in different layers of one device, and is thus very suitable for the manufacture of devices composed of sub-devices arranged at different heights in the device. An example of such a device is a micro-optical-electrical-mechanical system (MOEMS). When designing the diffractive element, or computing the amplitude level and phase level of each image cell, not only the specific lay-out of the device to be manufactured and the illumination wavelength, but also the gap width, or the distance to the image plane, is an input parameter. Thus, it becomes possible to design a diffractive element which has multiple focal planes within a single image field, which is a unique feature not known in the technique of proximity printing or wafer steppers and wafer step-and-scanners. This feature can be used to great advantage for the manufacture of a composed, multiple plane, device on a substrate having a step configuration. The device pattern portions for the different planes can be imaged simultaneously, so that a lot of time can be saved and alignment steps are no longer necessary.

An embodiment of the method, for forming a desired image with a minimum feature size of the order of 3 µm, is characterized in that use is made of a mask comprising image cells having a size of the order of 1 µm, a transmission of the order of either 100% or 0%, introducing a phase shift of either 0°, 90°, 180° or 270°, in that the information carrying surface of this mask is arranged at a distance of the order of 50 µm from the selected surface of the layer of sensitive material and in that a mercury arc lamp is used to illuminate the mask.

This embodiment demonstrates that the resolution in proximity printing can be raised to the level which has hitherto been only obtainable with real projection apparatus.

The embodiment is further characterized in that the mask is illuminated by radiation composed of 40% radiation having a wavelength of 365 nm, 20% radiation having a wavelength of 405 nm and 40% radiation having a wavelength of 436 nm.

For radiation of this composition a suitable diffraction element can be designed and if such diffraction element is used, an efficient use will be made of the radiation of a mercury arc lamp. The ratio 40:20:40 for the radiation components holds for the beam supplied by the lamp. Due to absorption in the resist, the effective contribution to the image formation of the wavelength components is 60:15:20.

The invention also relates to an optical mask for use in the method described above. This mask is characterized in that it has the form of a diffractive element and in that the image information is encoded in a two-dimensional array of image cells having dimensions smaller than the minimum feature size of the image to be formed, each image cell having one out of at least two specific transmission levels and one out of at least three phase levels.

It has been proved in practice that a good image can be obtained with such mask, having a limited number of amplitude and phase levels and thus a relatively simple design. A very good image with the above-mentioned minimum feature width of 3 µm can be printed with a mask having four phase levels. If an even better image is required a diffractive element having more than two amplitude levels and more than four phase levels can be designed and used in the method.

A practical embodiment of this mask is characterized in, that image cells with a reduced transmission are coated with a layer having a specific transmission and in that the phase level of each image cell is determined by the thickness of the mask substrate at the position of this cell.

The coating layer may be a layer of chromium, which material is used to full satisfaction in optical lithography. The phase structure may be etched in the mask substrate, for example of quartz, by ion beam technique.

The mask may be further characterized in that it comprises areas which differ from each other in that their image information is encoded such that, upon illumination of these areas and their surrounding areas with one illumination beam, the sub-images of these areas are formed in planes which differ from the planes wherein the sub-images of the surrounding areas are formed.

As explained above, such a mask is very suitable for simultaneously printing image portions in planes at different heights of a stepped substrate.

A practical embodiment of the mask is characterized in, that it comprises image cells having a size of the order of 1 $\mu$m, a transmission of the order of either 100% or 0% introducing a phase shift of either 0°, 90°, 180° or 270°.

The invention also relates to an apparatus for proximity printing, the apparatus comprising in this order:
- a radiation source emitting radiation of at least one predetermined wavelength;
- a mask holder for holding a mask which comprises image information and is at least partly transparent to the source radiation, and
- a substrate holder for holding a substrate provided with a layer of material which is sensitive to the radiation from the source. This apparatus is characterized in that the mask has the form of a diffractive element wherein the image information is encoded in a two-dimensional array of image cells having dimensions which are smaller than the minimum image feature size, each image cell having one out of at least two specific transmission levels and one out of at least three phase levels.

Preferably the apparatus is characterized in that the radiation source is configured to emit a radiation beam having an aperture angle of the order of a few degrees.

The image quality can be improved with such a, substantially collimated, beam.

The apparatus may be further characterized in that source radiation of at least two discrete wavelengths is incident on the plane of the mask.

Efficient use is then made of the available source radiation.

A practical embodiment of the apparatus is characterized in that the distance between the image information carrying surface of the mask and the surface of the sensitive layer is of the order of 50 $\mu$m.

With such a distance, or gap width, an image resolution of 3 $\mu$m can be obtained. If a higher resolution is required, for example, 1.5–2 $\mu$m, the gap width can be decreased, for example, to 25 $\mu$m.

The apparatus may be further characterized in that the radiation source emits radiation composed of 40% radiation having a wavelength 365 nm, 20% radiation having a wavelength 405 nm and 40% radiation having a wavelength 436 nm.

In such an apparatus, a conventional mercury arc lamp is used for the radiation source.

The invention also relates to a method of manufacturing a device in at least one layer on a substrate, the method comprising the steps of:
- forming an image, comprising features corresponding to device features to be configured in said layer, on a radiation-sensitive layer provided on said layer, and
- removing material from, or adding material to, areas of said layer which are delineated by the image formed in the sensitive layer. This apparatus is characterized in, that the method as described above is used for forming the image.

Devices which can be manufactured by means of this method are liquid crystalline display devices, customer ICs, printed circuit boards etc.

If the manufacturing method is further characterized in that use is made of a mask comprising areas which differ from each other in that their image information is encoded such that, upon illumination of these areas and their surrounding areas with one illumination beam, the sub-images of these areas are formed in planes which differ from the planes wherein the sub-images of the surrounding areas are formed, it is very suitable for manufacturing a device composed of sub-devices at different levels.

Examples of such devices are micro-optical-electrical systems and optical telecommunication devices comprising a diode laser, or a detector, and an optical fibre and possibly a lens between the fibre and the diode laser, or the detector.

These and other aspects of the invention are apparent from and will be elucidated, by way of non-limitative example, with reference to the embodiments described hereinafter.

Figure 1:
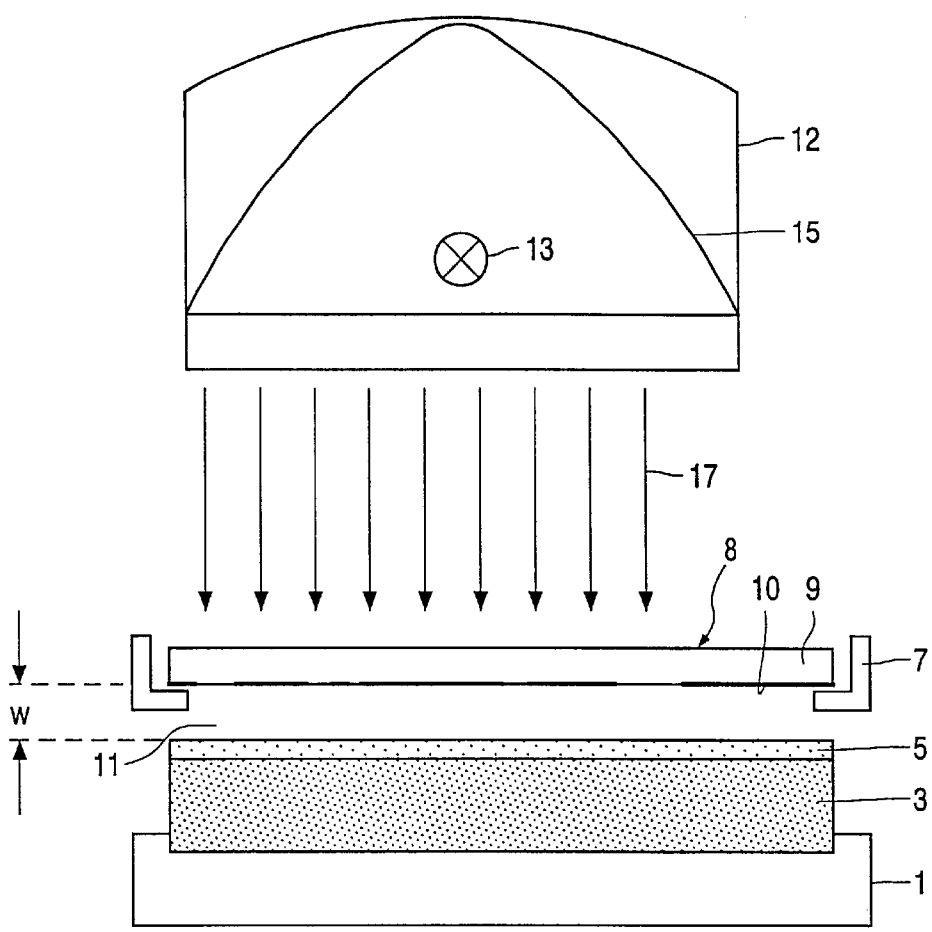
FIG. 1 shows schematically a conventional proximity printing apparatus.

FIG. 1 shows, very schematically, a conventional proximity printing apparatus for the manufacture of, for example an LCD device. This apparatus comprises a substrate holder 1 for carrying a substrate 3 on which the device is to be made. The substrate is coated with a radiation-sensitive, or resist, layer in which an image, having features corresponding to the device features is to be formed. The image information is contained in a mask 8 arranged in a mask holder 7. The mask comprises a transparent substrate 9, the lower surface of which is provided with a pattern 10 of transparent and non-transparent strips and areas which represent the image information. The pattern 10 is separated from the sensitive layer 5 by a small air gap 11 having a gap width w of the order of 100 $\mu$m. The apparatus further comprises a radiation source 12, which may comprise a lamp, for example, a mercury arc lamp and a reflector. Lamp radiation, which is emitted in backward and sideways directions, is reflected by this reflector towards the mask. The reflector may be a parabolic reflector and the lamp may be positioned in a focal point of the reflector, so that the radiation beam 17 from the radiation source is substantially a collimated beam. Other or additional optical elements, like one or more lens(es), may be arranged in the radiation source to ensure that the beam 17 is substantially collimated. This beam is rather broad and illuminates the whole mask pattern 10 which may have dimensions from 7.5×7.5 cm² to 18×18 cm². An illumination step only takes some 15 seconds, inclusive of alignment. After the mask pattern has been imaged in the resist layer, this is processed in the well-known way, i.e. the layer is developed and etched, so that the optical image is converted into a surface structure on the substrate.

The apparatus of FIG. 1 has a relatively simple construction and is very suitable for imaging a large area mask pattern in the resist layer. However, the image resolution is limited, due to diffraction effects which occur at the edges of the pattern features. For example, for a gap width w=100 µm, the resolution is 10 µm.

Figure 2A:
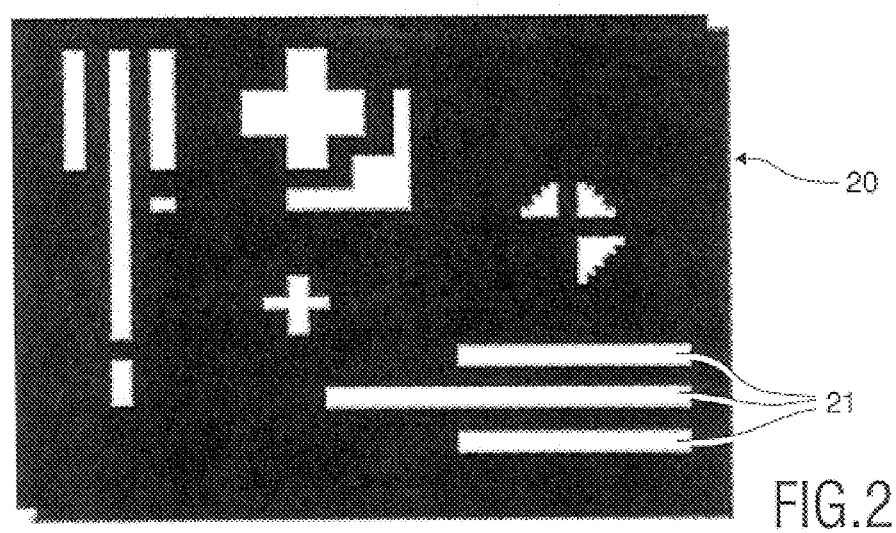
FIG. 2a shows the image which is to be printed.
Figure 2B:
FIGS. 2b and 2c show the intensity distribution in the image plane and the image formed in the resist layer, respectively as obtained with the conventional method and apparatus.
Figure 2C:
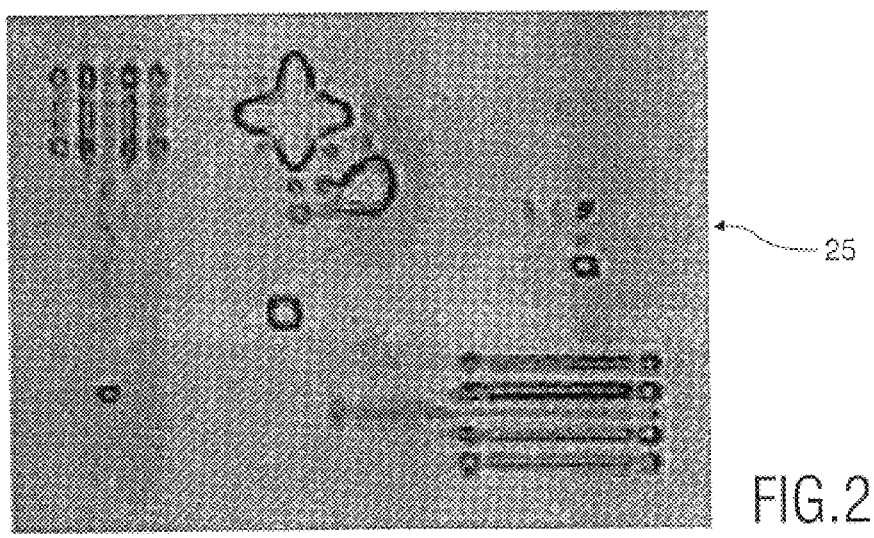

The limited resolution of the conventional apparatus is illustrated in FIGS. 2a, 2b and 2c. FIG. 2a shows the mask pattern 20 that should be imaged in the resist layer on a 1:1 scale, so that pattern 20 is also the required image. The strips 21, in the lower right corner, have a width of 3 µm and a mutual distance of 3 µm. If the mask is positioned at 50 µm from the resist layer and illuminated with a beam from a high-pressure mercury arc lamp and having an aperture angle of 1.5 degree, the microscopic intensity distribution 23 at the plane of the resist layer will be as shown in FIG. 2b. If the mask is illuminated with an exposure dose of 25 mJ/cm² and the resist is a HiPR6512 resist, which after illumination is developed in the liquid HPRD428, the pattern 25 formed in the resist will look as shown in FIG. 2c. Compared with the original pattern 20, the resist pattern 25 is strongly deformed and details of the original pattern 20 are no longer visible in the resist pattern. Especially the lines 21 of the original pattern are no longer clear and separated lines. This means that an imaging resolution of 3 µm cannot be obtained in the conventional proximity printing method.

Such a resolution, and even better resolutions, can be obtained by the method of the present invention. In this method, an effective use is made of diffraction at mask pattern features and the mask pattern has the form of a diffraction element composed of a two-dimensional array of image cells. The image information for a given location in the image plane is now distributed over more than one image cell and the image formed in the image plane is the result of the joint effects of these image cells. Compared with the conventional method, the new method provides the following advantages:

compensation for diffraction effects;

improved resolution;

increased depth of focus;

less sensitive to mask defects, and the possibility to have multiple focal planes within one image field.

Figure 3:
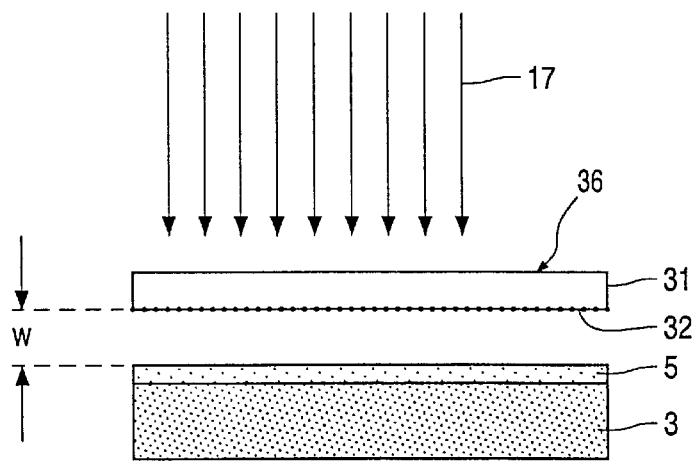
FIG. 3 shows an apparatus according to the invention.

The new method is illustrated in FIG. 3, which shows very schematically the apparatus for carrying out the method. The conventional mask 8 of FIG. 1 has been replaced by the diffraction mask 30, which comprises a transparent substrate 31 and a diffraction pattern 31. As the radiation source, the substrate holder and the mask holder are less relevant for understanding the new method, these elements are not shown in FIG. 3.

The diffraction element 30 comprises a two-dimensional array of discrete image cells with dimensions of, for example, 1×1 µm². Each of these cells has a given amplitude level, i.e. provides a given attenuation of the amplitude of the illumination beam portion passing through this cell, and a given phase level, i.e. provides a given phase shift of this beam portion. The layout of the diffraction element, i.e. the dimensions of the image cells and the number of amplitude and phase levels determines the quality of the image formed in the resist layer and may be different for different applications. For computing the optimum layout of the diffraction element 30, the required specific image pattern, the proximity gap width w and the wavelength of the illumination beam are the input parameters. The computation is based on the known Projections On Convex Sets (POCS)" method, which is an iterative inverse Fourier Transform method.

The computing algorithm uses the resist profile. The relative remaining resist thickness Rt, after exposing the resist with an exposure dose D and developing of the resist, is given by:

$Rt = 1 - (D/D_0)^\eta$ and $D = I \times t$ wherein $D_0$ is the clearing dose, i.e. the exposure dose needed for complete local resist clearing and $\eta$ is the contrast parameter of the resist. The actual exposure dose D at a given point in the resist plane is proportional to the local radiation intensity I and the exposure time t. This simple model holds for a positive resist and for a resist thickness which is small compared with the imaged feature size. In each cycle of the iterative mask pattern design algorithm the following general steps are performed:

determine the required amplitude distribution in the target plane, i.e. the plane of the resist layer;

calculate the amplitude and phase distribution in the mask plane using inverse wave propagation, thereby taking the initial phase distribution in the target plane slightly curved;

transform the obtained complex amplitude and phase distribution in the mask plane into discrete levels, for example, two amplitude levels, four phase levels and an image cell size of one micron squared;

apply a forward projection in the target plane using the digitized phase and amplitude distribution in the mask plane, thereby obtaining a phase and amplitude distribution in the target plane;

determine from the amplitude distribution in the target plate the corresponding intensity profile;

convert this profile into a pattern of resist thicknesses Rt according to the above equation, and access the performance of the calculated design.

The last step comprises comparing for each image cell the resulting resist profile with the corresponding target pattern. To perform this operation the analogue resist profile is converted into a binary profile. An image cell comprising resist is labelled "good" if $Rt \geq 0.5$, and an image cell having no resist is labelled "good" if Rt=0. In other cases the image cells are labelled "wrong". This quality assessment is used as a merit function. After this cycle a new phase and amplitude distribution is generated and the next cycle of the iterative process is started. This design process is continued until the output becomes stable. The number of cycles to be run depends on the complexity of the required target pattern; usually a number of five cycles will be sufficient.

Figure 4A:
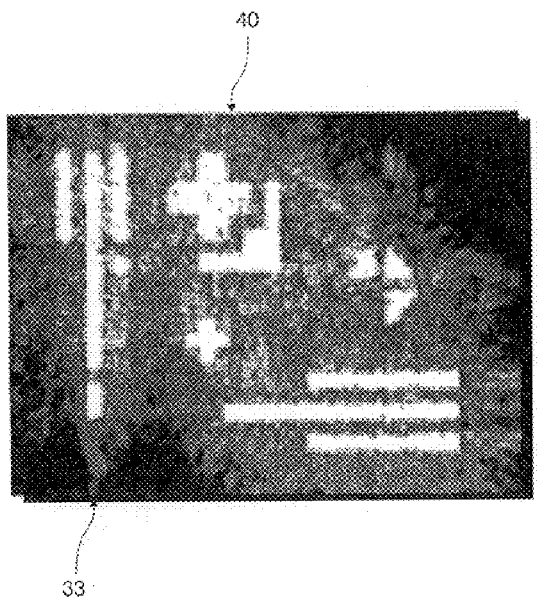
FIGS. 4a and 4b show the computed intensity distribution and the image formed in the resist layer, respectively as obtained with the method and apparatus according to the invention.
Figure 4B:
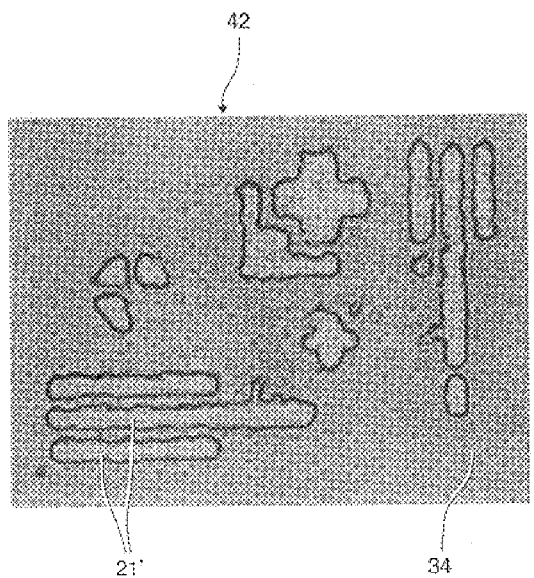

FIGS. 4a and 4b show the computed microscopic radiation intensity distribution 40 and the image 42 formed in the resist, respectively, realised by the new method for the same required substrate image as shown in FIG. 2a. The 3 µm wide strips 21' are clearly visible and separated from each other, which demonstrates that a resolution of 3 µm is also possible with proximity printing if a special diffraction element is used for the mask.

Figure 5A:
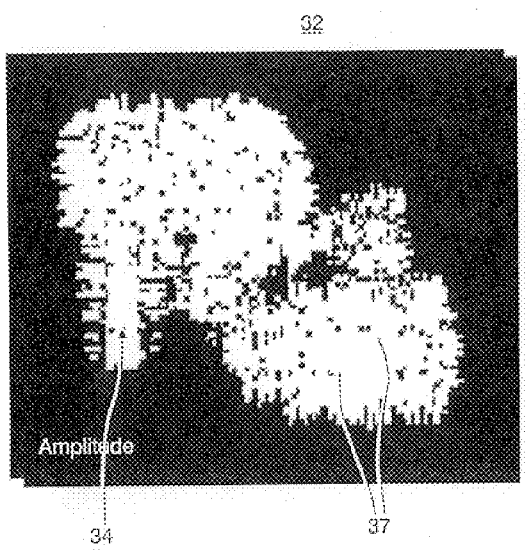
FIGS. 5a and 5b show the amplitude structure and the phase structure, respectively of a diffraction mask according to the invention.
Figure 5B:
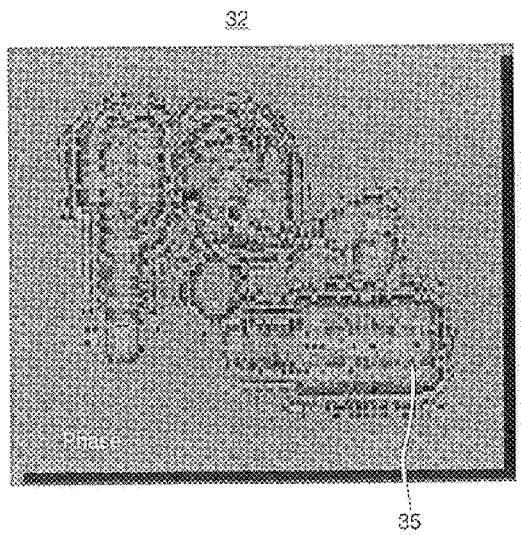

For this embodiment, a mask is used wherein the image cells have a dimension of 1×1 µm², two amplitude levels and four phase levels: 0, 90, 180 and 270 degrees. FIG. 5a shows the amplitude structure 34 of the mask and FIG. 5b shows its phase structure 35. As will be clear from these Figures most of the image information is comprised in the phase structure; only a few image cells 37 have an amplitude level different from the level of the other cells.

Figure 6A:
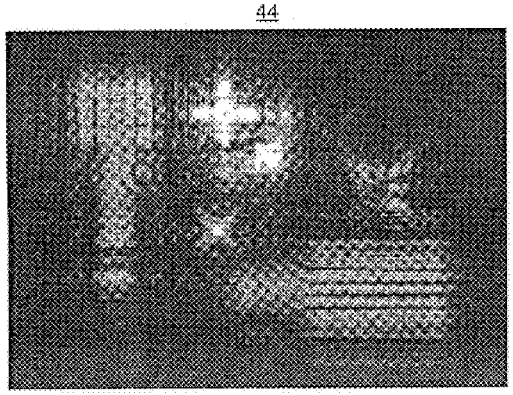
FIGS. 6a and 6b show the intensity modulation and the phase modulation, respectively induced by this mask.
Figure 6B:
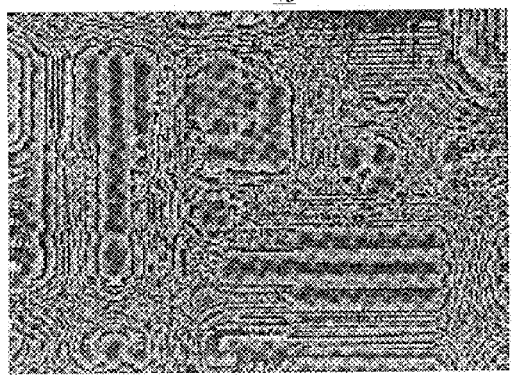

The intensity modulation 44 and the phase modulation 45 provided by this mask are shown in FIGS. 6a and 6b, respectively.

Figure 7:
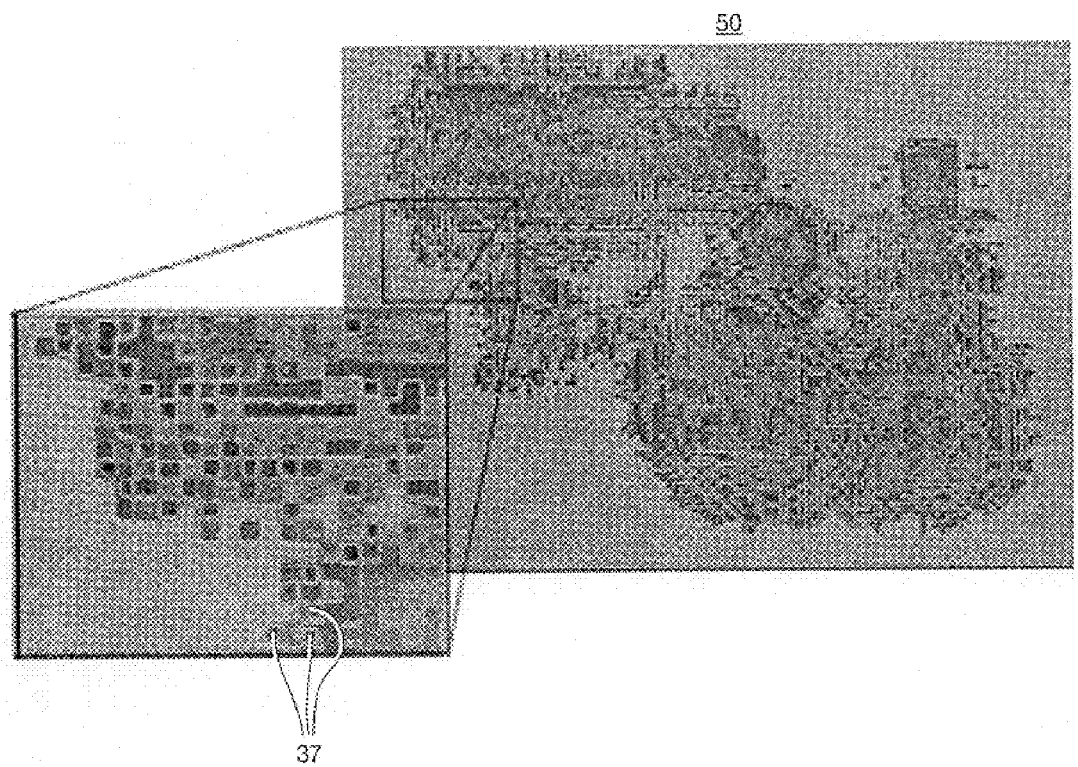
FIG. 7 shows a SEM photograph of this mask.

FIG. 7 shows a picture 50 of the fabricated mask, which picture is taken by a scanning electron microscope (SEM) and an enlargement 51 of a portion of this picture. The individual image cells 37 and their different levels are now clearly visible.

The two amplitude levels, substantially 100% transmission and substantially 0% transmission, in this embodiment of the mask can be realised by covering the non-transmission image cells with a chromium layer. Chromium is a material that is generally used for forming amplitude structures in masks. All non-transmission cells can be provided with chromium simultaneously, using known lithographic techniques.

Figure 8:
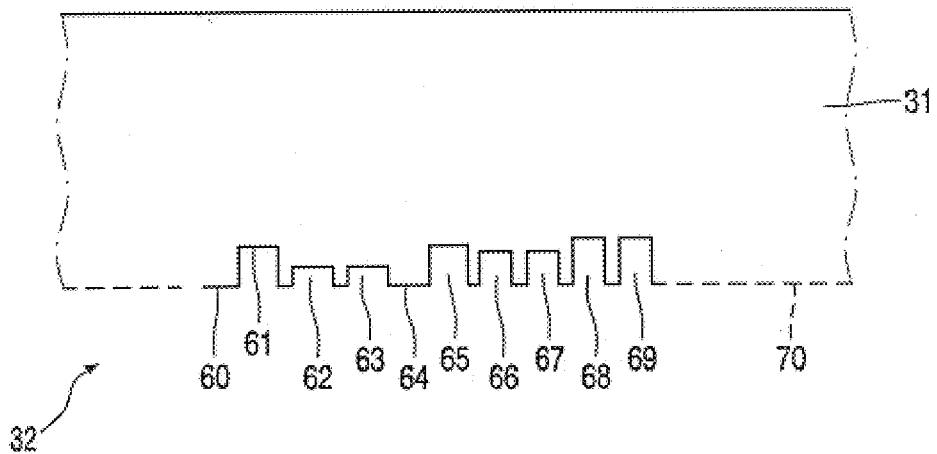
FIG. 8 shows a cross-section of a part of the mask with the phase structure.

The four phase levels in this embodiment of the mask can be realised by giving the image information carrying surface of the mask substrate a step structure, so that each image cell has one out of four different height levels, as illustrated in FIG. 8. This, very schematic, Figure shows a small part of the diffraction mask 30 in cross-section with a small number (10) of image cells. The broken line 70 represents the image information carrying surface of the mask substrate 31. The cells 60 and 64 are situated in this plane, so that the illumination beam portions passing through do not undergo a phase shift with respect to the beam portions which pass through mask areas that are not provided with image cells. The cells 62 and 63 have a depth $d_1$ such that they introduce a phase shift of 90°, which means that the depth is equal to: ¼.λ.(n−1), wherein λ is the wavelength of the illumination beam and n is the refractive index of the substrate material. The cells 61, 66 and 67 have a depth $d_2$=½.λ.(n−1) so that they introduce a phase shift of 180°. The cells 65, 68 and 69 have a depth $d_3$=¾.λ.(n−1) so that they introduce a phase shift of 270°.

The diffraction mask with the multilevel phase structure can be manufactured by means of known lithographic techniques. For example, by means of an electron beam pattern generator, the cell pattern can be written in a resist which is sensitive to electrons, and the different levels can be realised by selective ion etching. After the mask substrate surface 70 has been provided with the multilevel phase structure, this surface is selectively coated with chromium to give the mask the required amplitude structure.

Instead of chromium, other non-transmission materials can be used for the selective coating of the mask. Instead of 100% transmission and 0% transmission for the amplitude levels, the mask may have different amplitude levels.

As demonstrated above, good results are obtained with a diffraction mask structure having two amplitude levels and four phase levels and image cell dimensions of 1×1 $\mu m^2$. However, the mask structure for the above and other applications may have three or more than four phase levels and/or more than two amplitude levels and/or different dimensions for the image cell areas. In general, it holds that with decreasing cell area dimensions and an increasing number of amplitude and phase levels the quality of the printed image will enhance.

An important parameter for the imaging process is the degree to which the illumination beam is collimated. If this beam is fully collimated, i.e. the aperture of this beam is zero, the printed image may have a speckle pattern. This effect is caused by interference of beam portions diffracted by the mask structure, which interference results in intensity peaks in the printed image. By using an illumination beam with a small aperture angle, for example of the order of a few degrees, the intensity of said peaks is spread across the image and the speckle pattern is reduced to a sufficient degree. The small aperture of the illumination beam seems to be negligible, but has a considerable effect on the interference phenomena.

Figure 9A:
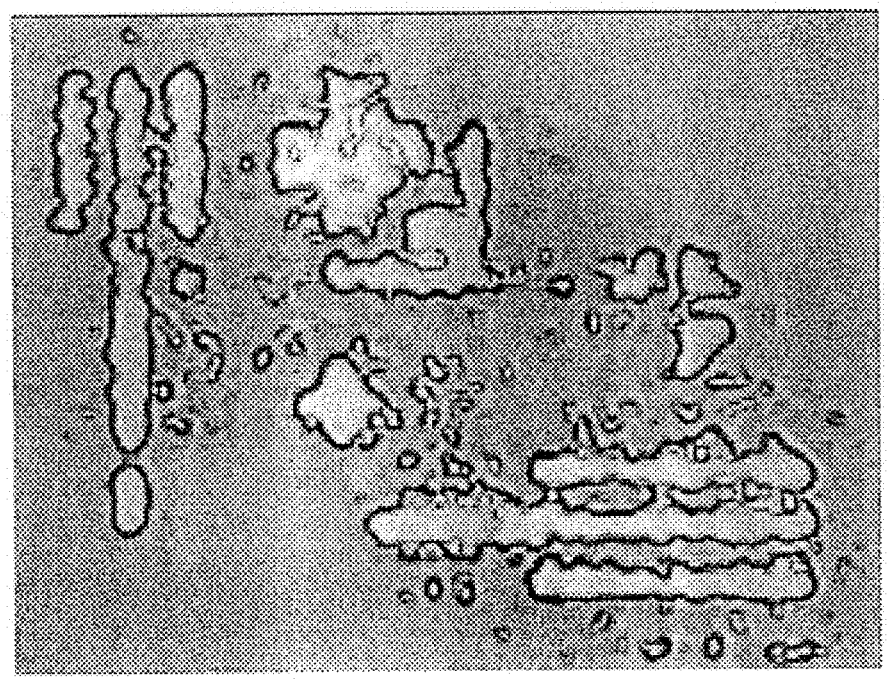
FIGS. 9a, 9b and 9c show the image of the same mask formed in the resist layer for different gap widths, respectively.
Figure 9B:
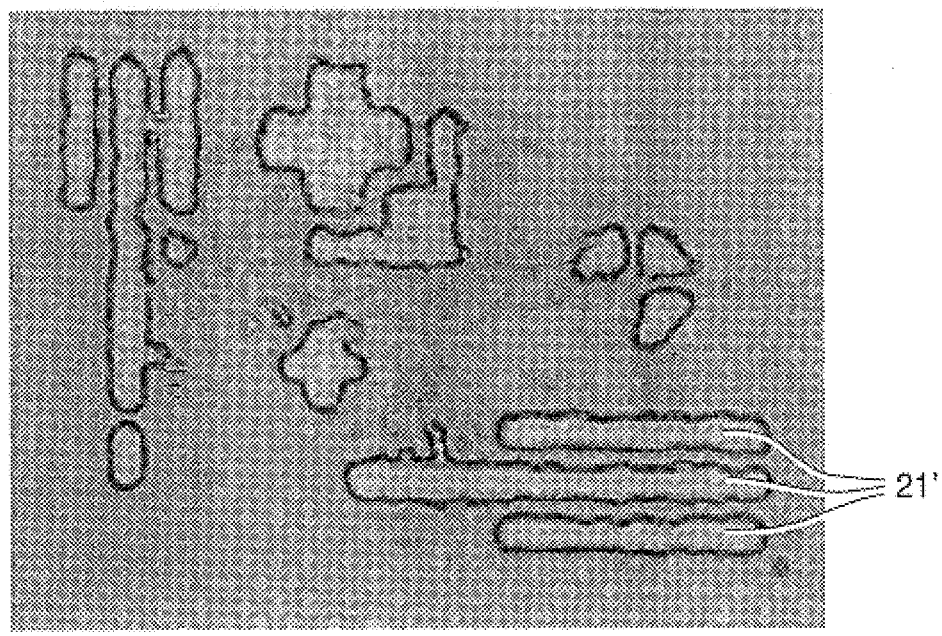
Figure 9C:
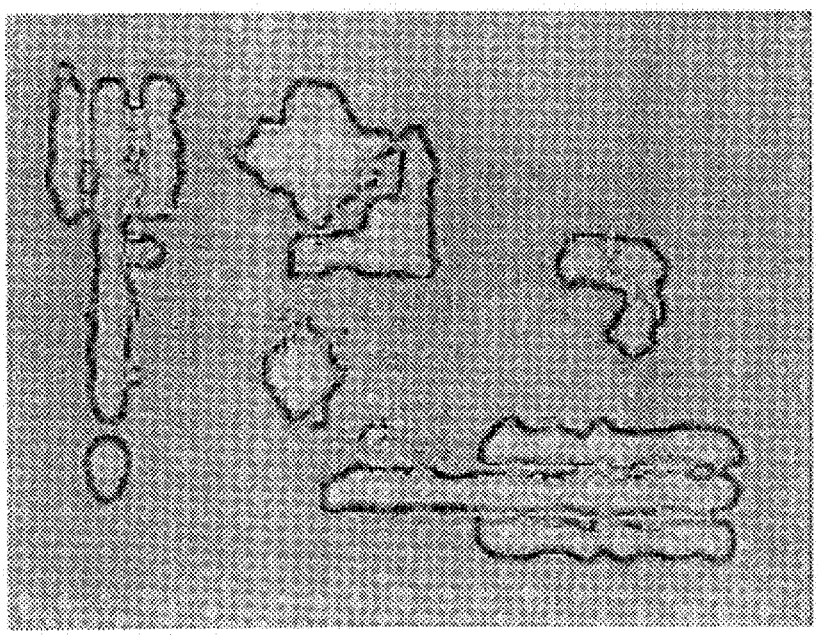

An essential parameter for the imaging process is the gap width w. The gap width is one of the input parameters for computing the diffraction mask structure and is determined by the required image resolution. If a diffraction mask structure is computed and manufactured for a given gap width and resolution, this resolution can only be obtained for the given gap width. If, in real printing circumstances, the real gap width deviates from said given gap width, the required resolution cannot be achieved. This is demonstrated in FIGS. 9a, 9b and 9c. These Figures show the images formed in the resist layer by means of the same diffraction mask, designed for a gap width of 50 $\mu$m, and under the same illumination conditions, but with different gap widths. FIGS. 9a, 9b and 9c show the image obtained with a gap width of 40 $\mu$m, a gap width of 50 $\mu$m and a gap width of 60 $\mu$m, respectively. For all cases, the illumination dose is 25 mJ/cm². Only the image 42 of FIG. 9b, formed with a 50 $\mu$m gap width, shows sufficiently sharp and separated strips of 3 $\mu$m width. Such strips are not present in the images formed with a gap width of 40 $\mu$m (FIG. 9a) and a gap width of 60 $\mu$m (FIG. 9c).

The maximum resolution is related to the gap width. If the gap width is reduced, the resolution will be increased. A smaller gap width requires a better control of this width. Whereas in the above embodiment a resolution of 3 $\mu$m is obtained with a gap width of 50 $\mu$m, a resolution of 1.5 to 2 $\mu$m is possible for a gap width of 25 $\mu$m. A better control of the gap width will open the way to smaller gap widths and to higher resolutions.

The resolution can be increased considerably by decreasing the image cell size, for example to 0.1 $\mu$m, increasing the number of amplitude and phase levels, for example to eight and decrease the gap width, for example to 10 $\mu$m.

As in the mask of the invention the information about a pixel of the image to be printed is not contained in a single picture cell but in a number of such cells, the imaging process is less sensitive to deficiencies in the mask, like dust particles and scratches. This is quite an advantage of the new mask.

Moreover, and even more important, is the insight that the nature of the mask of the invention provides the unique possibility of creating multiple focal planes within a single image field. As explained above, the mask is designed, or computed, on a cell-by-cell basis, in which the distance between the mask and the resist layer, or the focal distance, is one of the input parameters. This provides the possibility of designing a mask wherein one or more area(s), comprising a number of picture cells, is (are) intended for a different focal distance than the remaining portion of the mask. This multiple focal mask can be used for the manufacture of a device composed of sub-devices positioned at different levels. Such a device may be a pure electronic device or a device that comprises two or more different kind of features out of the range electrical, mechanical or optical systems, for example a micro-mechanical-optical-electrical system (MOEM) or a device comprising a diode laser or a detector and a fibre and possibly lens means to couple light from the laser into the fibre or from the fibre to the detector. The lens means may be planar diffraction means. For the manufacture of a multilevel device, a substrate is used that has a resist applied on different levels. By using a multiple focal mask pattern, all sub-images can be printed simultaneously on the relevant levels, so that a lot of time can be saved.

The method of the invention can be carried out with a robust apparatus that is, moreover quite simple as compared with a stepper or step-and-scan lithographic projection apparatus. In a conventional proximity printing apparatus, a mercury arc discharge lamp is used in the radiation source. Such a lamp emits radiation in a number of spectral lines, or wavelengths. The radiation efficiency of such an apparatus is considerably improved if radiation of more than one wavelength can be used for illuminating the mask. It has been found that, if such a lamp is used for carrying out the invention, the best results are obtained if 40% of the illumination radiation has a wavelength of 365 nm, 20% of this radiation has a wavelength of 405 nm and 40% has a wavelength of 436 nm. The effective contribution to the image formation of this lamp radiation is 60% by the 365 nm component, 15% by the 405 nm component and 25% by the 436 nm component due to the absorption in the resist layer. In addition to the advantage of a better radiation efficiency, the use of a radiation source, which emits more than one wavelength provides the additional advantage that formation of a speckle pattern is avoided. The intensity peaks of the speckle pattern for the different wavelengths are shifted with respect to each other, which results in an averaging of these peaks and thus in a reduction of the speckle pattern.

It will be clear that the invention is not limited to the use of a specific wavelength (band). Instead of radiation with a wavelength of the order of 400 mn, radiation with different wavelengths in the ultraviolet (UV) range or in the deep UV (DUV) range, for example the lithographic wavelengths of 243 nm, 193 nm or 157 nm may be used.

In practice, the method of the invention will be applied as one step in a process for manufacturing a device in at least one layer on a substrate. After the image has been printed in the resist layer on said layer, material is removed from, or added to, areas of said layer which are delineated by the printed image. These process steps of imaging and material removing or adding are repeated for all layers until the whole device is finished. In those cases where sub-devices are to be formed at different levels and used can be made of multiple level substrates, for image printing a multiple focal mask can be used.

The invention can be used for printing patterns of, and thus for manufacturing display devices like LCD, Plasma Displays and PolyLed Displays, printed circuit boards (PCB) and micro multiple function systems (MOEMS).

What is claimed is:

1. A method of forming a desired optical image having a give minimum feature size on a selected surface of a layer of material sensitive to optical radiation, the method comprising the steps of:
   providing a source of optical radiation having at least one predetermined wavelength $\lambda$;
   providing a layer of material, sensitive to optical radiation having the wavelength $\lambda$, with a selected surface to receive an optical image thereon;
   positioning a mask, comprising image information and being at least partly transparent to the source radiation, between the radiation source and the layer of sensitive material, so that source radiation is transmitted through the mask towards the sensitive layer, and
   illuminating the selected surface with source radiation received by transmission through the mask to produce the desired optical image, characterized in that use is made of a mask in the form of a diffractive element wherein the image information is encoded in a two-dimensional array of image cells having dimensions which are smaller than the minimum feature size, each image cell having one out of at least two specific transmission levels and one out of at least three phase levels.

2. A method as claimed in claim 1, characterized in that the illumination step comprises illuminating the mask with a beam having an aperture angle of the order of a few degrees.

3. A method as claimed in claim 1, characterized in that use is made of a radiation source which emits radiation of at least two discrete wavelengths.

4. A method as claimed in claim 1, characterized in that use is made of a mask which comprises areas which differ from each other in that their image information is encoded such that, upon illumination of these areas and their surrounding areas with one illumination beam, the sub-images of these areas are formed in planes different from the planes wherein the sub-images of the surrounding areas are formed.

5. A method as claimed in claim 1, for forming a desired image with a minimum feature size of the order of 3 $\mu$m, characterized in that use is made of a mask comprising image cells having a size in the order of 1 $\mu$m, a transmission of the order of either 100% or 0%, introducing a phase shift of either 0°, 90°, 180°, or 270°, in that the image information carrying surface of this mask is arranged at a distance of the order of 50 $\mu$m from the selected surface of the layer of sensitive material, and in that a mercury arc lamp is used to illuminate the mask.

6. A method as claimed in claim 1, characterized in that the mask is illuminated by radiation composed of 40% radiation having a wavelength of 365 nm, 20% radiation having a wavelength of 405 nm and 40% radiation having a wavelength of 436 nm.

7. An optical mask comprising image information and for use with in the method as claimed in claim 1, characterized in that it has the form of a diffractive element, and in that the image information is encoded in a two-dimensional array of image cells having dimensions which are smaller than the minimum feature size of the image to be formed, each image cell having one out of at least two specific transmission levels and one out of at least three phase levels.

8. An optical mask as claimed in claim 7, characterized in that image cells with a reduced transmission are coated with a layer having a specific transmission, and in that the phase level of each image cell is determined by the thickness of the mask substrate at the position of this cell.

9. An optical mask as claimed in claim 7, characterized in that it comprises areas which differ from each other in that their image information is encoded such, that upon illumination of these areas and their surrounding areas with one illumination beam, the sub-images of these areas are formed in planes which differ from the planes wherein the sub-images of the surrounding areas are formed.

10. An optical mask as claimed in claim 7, characterized in that it comprises image cells having a size of the order of 1 $\mu$m, a transmission of the order of either 100% or 0% introducing a phase shift of either 0°, 90°, 180° or 270°.

11. An apparatus as claimed in claim 10, characterized in that the radiation source is configured to emit a radiation beam having an aperture angle of the order of a few degrees.

12. An apparatus for carrying out the method as claimed in claim 1, the apparatus comprising in this order:

a radiation source emitting radiation of at least one predetermined wavelength;

a mask holder for holding a mask which comprises image information and is at least partly transparent to the source radiation, and a substrate holder for holding a substrate provided with a layer of material which is sensitive to the radiation from the source, characterized in that the mask has the form of a diffractive element wherein the image information is encoded in a two-dimensional array of image cells having dimensions which are smaller than the minimum image feature size, each image cell having one out of at least two specific transmission levels and one out of at least three phase levels.

13. An apparatus as claimed in claim 11, characterized in that source radiation of at least two discrete wavelengths is incident on the plane of the mask.

14. An apparatus as claimed in claim 11, characterized in that the distance between the image information carrying surface of the mask and the surface of the sensitive layer is of the order of 50 µm.

15. An apparatus as claimed in claim 11, characterized in that the radiation source emits radiation composed of 40% radiation having a wavelength of 365 nm, 20% radiation having a wavelength of 405 nm and 40% radiation having a wavelength of 436 nm.

16. A method of manufacturing a device in at least one layer on a substrate, the method comprising the steps of:

forming an image, comprising features corresponding to device features to be configured in said layer, on a radiation sensitive layer provided on said layer, and removing material from, or adding material to, areas of said layer which are delineated by the image formed in the sensitive layer, characterized in that the image is formed in accordance with the method as claimed in claim 1.

17. A method as claimed in claim 16, suitable for forming a device in several layers, characterized in that use is made of a mask comprising areas which differ from each other in that their image information is encoded such that, upon illumination of these areas and their surrounding areas with one illumination beam, the sub-images of these areas are formed in planes which differ from the planes wherein the sub-images of the surrounding areas are formed.

* * * * *